United States Patent [19]
Li

[11] Patent Number: 5,627,103
[45] Date of Patent: May 6, 1997

[54] METHOD OF THIN FILM TRANSISTOR FORMATION WITH SPLIT POLYSILICON DEPOSITION

[75] Inventor: Jia Li, San Antonio, Tex.

[73] Assignees: Sony Corporation, Tokyo, Japan; Sony Electronics, Inc., Park Ridge, N.J.

[21] Appl. No.: 397,748

[22] Filed: Mar. 2, 1995

[51] Int. Cl.⁶ .................. H01L 21/44; H01L 21/48
[52] U.S. Cl. .................. 438/158; 438/647; 438/486; 438/166
[58] Field of Search .................. 437/194, 193, 437/41 TFT, 191, 40 GS, 41 GS, 29, 52

[56] References Cited

U.S. PATENT DOCUMENTS

| | | | |
|---|---|---|---|
| 4,178,674 | 12/1979 | Liu et al. | 437/191 |
| 5,047,360 | 9/1991 | Nicholas | 437/29 |
| 5,151,387 | 9/1992 | Brady et al. | 437/191 |
| 5,246,876 | 9/1993 | Manning | 437/52 |
| 5,320,980 | 6/1994 | Bae et al. | 437/193 |
| 5,338,699 | 8/1994 | Ohi et al. | 437/52 |
| 5,346,836 | 9/1994 | Manning et al. | 437/52 |
| 5,348,903 | 9/1994 | Pfiester et al. | 437/193 |
| 5,429,962 | 7/1995 | Yang | 437/191 |
| 5,464,793 | 11/1995 | Roehl | 437/191 |

*Primary Examiner*—Charles L. Bowers, Jr.
*Assistant Examiner*—Lynne A. Gurley
*Attorney, Agent, or Firm*—Wood, Herron & Evans, P.L.L.

[57] ABSTRACT

An interconnect between a conductor and a transistor body above a gate electrode is established by forming a conductor separated and alongside a gate electrode. Both the conductor and the gate electrode are coated with a dielectric material such as silicon dioxide. The silicon dioxide layer is subsequently coated with a thin layer of polysilicon and a contact hole is photolithographically etched through the polysilicon layer and through the silicon dioxide layer to establish a contact hole to said conductor. The polysilicon layer protects the silicon dioxide layer from impurities in the photolithography process. After the photolithographic mask is removed, a second layer of polysilicon is deposited on the first layer of polysilicon, coating the polysilicon layer and partially filling the contact hole, establishing a contact between the combined polysilicon layers and the conductor. The combined polysilicon layer is then further etched to define the transistor body and the connector between the conductor and the transistor body. The channel, the source and drain electrodes, and the connection lines are then doped separately to complete the transistor. This is paticularly useful when a first transistor source or drain is connected to a second, adjacent, transistor gate electrode.

9 Claims, 2 Drawing Sheets

METHOD OF THIN FILM TRANSISTOR FORMATION WITH SPLIT POLYSILICON DEPOSITION

BACKGROUND OF THE INVENTION

In the manufacture of integrated circuits with thin film transistors, it is frequently necessary to provide an electrical interconnection between a transistor and an adjacent conductor. This can be used in several applications. The conductor can be the source, the drain, or the gate electrode of an adjacent thin film transistor.

Such interconnects are now manufactured in a way that the gate dielectric layer of the thin film transistor tends to be contaminated. FIGS. 1A–1E show the method currently used to manufacture such interconnects. As shown in FIG. 1A, a silicon wafer 11 has bulk transistors in place (not shown), as well as a gate electrode 12 for the to-be-formed thin film transistor and a conductor 13. In this embodiment, the conductor can be the gate electrode, the source, or the drain electrode of an adjacent transistor. A blanket silicon dioxide layer 14 is deposited over the gate electrode, as well as the adjacent conductor. A photoresist layer 15 is applied over the oxide layer 14 and a contact opening 16 is defined. The oxide 14 is then etched, the photoresist 15 removed and the wafer cleaned to provide a contact 17 through the oxide layer 14 to the conductor 13. A layer of polysilicon 18 is deposited. This forms the thin film transistor body and provides a contact 19 connecting the conductor 13 and the transistor body 20 which is formed by photolithographically defining and etching the polysilicon layer 18 above the gate electrode 12. One can then deposit a screen oxide layer and implant the polysilicon to adjust the threshold voltage of the thin film transistor, as desired. The source and drain electrodes are then photolithographically defined and doped, as necessary.

The problem associated with this method is that the photolithographic process imparts impurities into the gate dielectric layer which, in turn, causes the performance of the thin film transistor to degrade.

In the past, this problem has been addressed by merely cleaning the silicon wafers before the body polysilicon deposition and limiting the time of exposure of the wafers to air before the polysilicon deposition. This, however, has proven to be somewhat ineffective and does not totally overcome the problem.

SUMMARY OF THE INVENTION

Accordingly, it is an object of the present invention to provide a method of establishing a polysilicon interconnect between a conductor and thin film transistor body wherein the gate oxide layer is not subjected to photolithography and the associated cleaning process.

According to the present invention, a polysilicon interconnect is formed between the thin film transistor body above the gate electrode and a conductor by coating the wafer with a gate dielectric layer. The gate dielectric layer is coated with a first layer of polysilicon. This first layer should be approximately one-half the thickness of the intended final polysilicon layer. A photoresist layer is then deposited on the first polysilicon layer and a contact opening is defined above the conductor. The exposed portion of the polysilicon and oxide layers are then etched away down to the conductor layer.

The photoresist is removed, leaving a contact opening through the first polysilicon layer and the dielectric layer to the conductor. A second layer of polysilicon is then deposited over the first layer and into the contact opening, providing a continuous circuit between the combined polysilicon layers and the conductor. Both of these polysilicon layers are then photolithographically defined and etched to form the source, the drain, and the channel region of the thin film transistor, and the connection lines. This provides a connection between the conductor and the polysilicon body layer. The thin film transistor can be further processed to dope the source and drain electrodes, and to provide other features, as necessary.

The objects and advantages of the present invention will be further appreciated in light of the following detailed description and drawings.

DETAILED DESCRIPTION

Figure 1A:
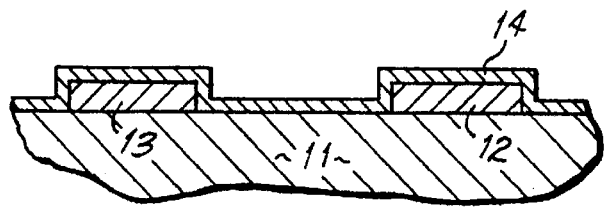
FIGS. 1a–1e are diagrammatic depictions in cross-section of a prior art process of forming thin film transistors.
Figure 1B:
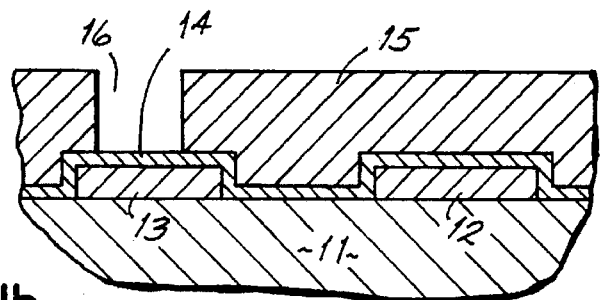
Figure 1C:
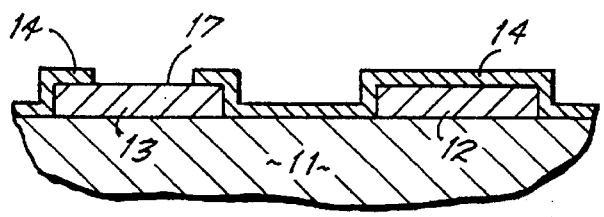
Figure 1D:
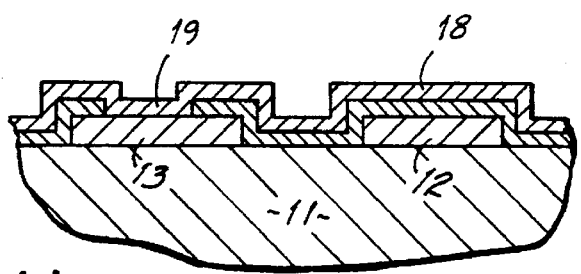
Figure 1E:
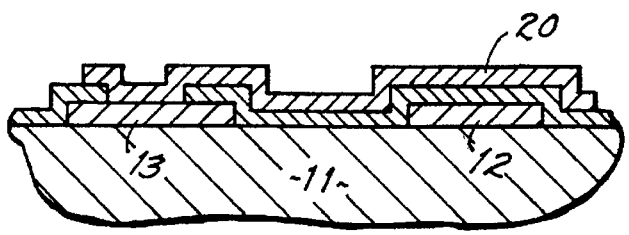
Figure 2:
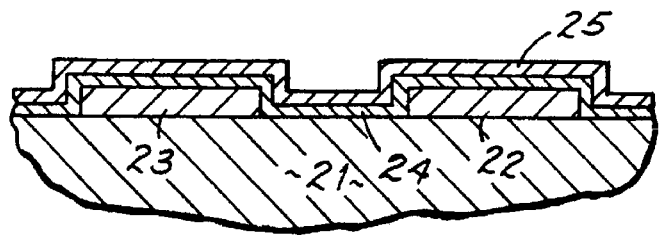
FIG. 2 is a cross-sectional diagrammatic depiction of a first step of the present invention.

As shown in FIG. 2, in order to form a thin film transistor according to the method of the present invention, a gate electrode 22 and adjacent conductor 23 are formed on the surface of a substrate 21. Generally, in practicing the present invention, the substrate 21 will be silicon, glass, quartz, sapphire or other substrate typically employed for semiconductors. Generally, silicon wafers will be employed. These frequently already have bulk transistors and interconnect layers with vertical isolation layers and the like already formed.

The gate electrode 22 and the conductor 23 are formed by depositing a conducting layer, photolithographically defining and etching this layer to define the gate electrode 22 and the conductor 23, as shown in FIG. 2. Conductor 23 can also be a previous layer that needs to be connected to the thin film transistor.

A gate dielectric layer 24 is deposited as a continuous layer that covers portions of both the conductor 23 and the gate electrode 22. The dielectric material 24 can be any typical insulating material such as silicon nitride or silicon dioxide, which is preferred. These can be deposited by low pressure chemical vapor deposition or plasma enhanced chemical vapor deposition. The preferred method of depositing this film is low pressure chemical vapor deposition. Preferably the dielectric layer will be a layer of silicon dioxide having a thickness of 100 to about 1000 angstroms, depending upon the particular application. After deposition, the dielectric layer can be annealed, as required.

A continuous semiconductor layer 25 is then deposited to cover the dielectric layer 24. This layer can be any semiconductor material suitable for use as a transistor body. Generally, polycrystalline silicon is employed. Although the particular thickness of the semiconductor layer 25 can vary, depending upon the desired application, the thickness of this layer 25 should be about one-half of the desired final thickness of the thin film transistor body. This shall be described hereinafter. This layer is likewise deposited by known techniques such as low-pressure chemical vapor deposition and can be deposited as a polysilicon layer or as amorphous silicon and annealed later at a temperature of about 650° C. to form the polysilicon.

Figure 3:
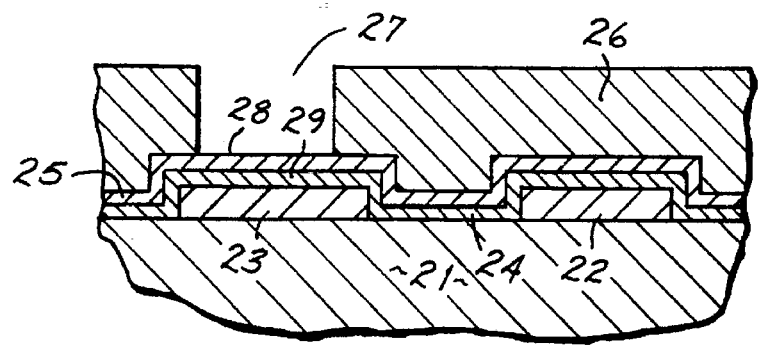
FIG. 3 is a diagrammatic cross-section of a second step used in the present invention.

As shown in FIG. 3, a photoresist layer 26 is next deposited, covering the first polysilicon layer 25. This is then photolithographically treated to establish a photoresist image having a contact opening 27 directly above the conductor and exposing a portion of the first polysilicon layer 25.

The selection of the appropriate photoresist material is a matter of choice. Commercially available photoresist materials are available and can be purchased, for example, from Hoechst Celanese Corporation or Shipley Company.

Figure 4:
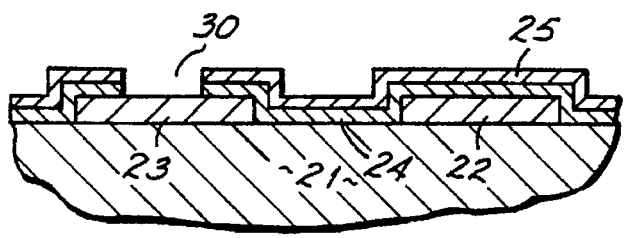
FIG. 4 is a diagrammatic cross-sectional view of a third step used in the present invention.

The exposed portion 28 of the first polysilicon layer 25 is etched using a plasma etcher. This, in turn, exposes a portion 29 of the dielectric layer. This can be done in an environment of, for example, silicon hexafluoride, chlorine and difluoromethane. This same etching chemistry can then be employed to etch away the subsequently exposed portion 29 of the dielectric layer 24, providing a contact opening 30 to conductor 23. The masking portions of the photoresist layer 26 are then removed using the appropriate solvent or acid solution or, if preferred, an oxygen plasma. The wafer is cleaned, providing the structure shown in FIG. 4 having a contact opening 30.

Figure 5:
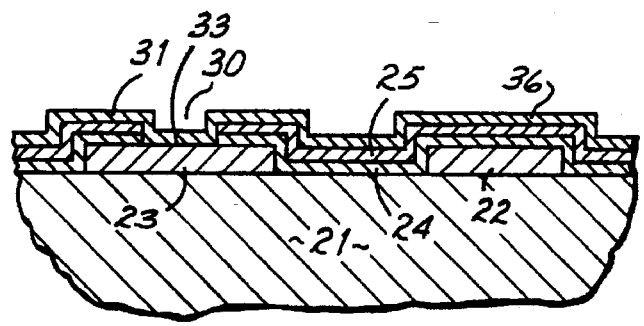
FIG. 5 is a diagrammatic cross-sectional view of a fourth step used to form the present invention.

As shown in FIG. 5, a second layer 31 of polysilicon is deposited over the exposed surface of the initial polysilicon layer 25. This continuous layer extends into the contact opening 30 and coats the exposed portion 33 of conductor 23, providing an electrical path from conductor 23 to the combined polysilicon layers 25 and 31. The thickness of deposited layer 31 is selected so that the combined thickness of first polysilicon layer 25 and second polysilicon layer 31, i.e., the combined polysilicon layer, has a thickness effective to provide the necessary characteristics for the thin film transistor body for use in the present invention. Typically, this may be, for example, 100 to 3,000 Å or more in total thickness and generally a total thickness of about 500 Å, is adequate, although this particular thickness can be varied widely, depending upon the particular application. This second layer can also be deposited in the form of amorphous silicon, and then annealed to crystalize. The preferred way of forming the polysilicon transistor body is to deposit both the first and the second parts of the transistor body layer in the form of amorphous silicon and anneal the wafer after depositing the second part to form a single layer of polysilicon.

Figure 6:
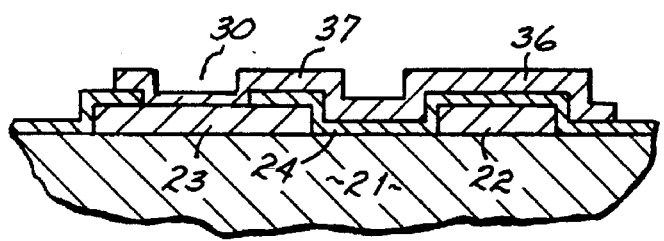
FIG. 6 is a cross-sectional view of a thin film transistor made according to the present invention.

This product is then processed, as shown in FIG. 6, by photolithographically defining and etching the combined polysilicon layer to form the thin film transistor body 36 above the gate electrode 22, separated by the gate dielectric 24. This also provides a connection line 37 from the contact opening 30 and conductor 23 to the thin film transistor body 36. The formed transistor body is then further processed, as desired, by appropriate doping to establish necessary source, drain and channels. These are all formed by standard transistor-forming techniques.

The present invention can be particularly adapted to provide connections between adjacent thin-film transistors wherein part of the combined conducting layer is a thin film transistor drain electrode, and conductor 23 is a lead to the gate electrode of another transistor.

In a more specific embodiment, a transistor can be formed according to the following procedure which is merely exemplary for practicing the present invention.

On top of a silicon wafer which has bulk transistors, interconnect lines, isolations in place and contact holes open, deposit 500 Å of polysilicon.

Coat the wafer with a photoresist material, align and expose the photoresist on stepper with a photomask, and then develop the photoresist. This will leave the photoresist only on the portions of the wafer where the polysilicon will remain as the gate electrode and conductor electrode. Next, etch the polysilicon and subsequently ash the photoresist in oxygen plasma and clean the wafer.

Deposit 500 Å of silicon dioxide onto the wafer. Anneal in oxygen at 850° C. for 10 minutes. Coat the silicon dioxide layer with 250 Å of amorphous silicon. Coat the amorphous silicon layer with a photoresist and align and expose the photoresist with a mask and develop the photoresist so that photoresist covers the amorphous silicon layer except where the contact hole to the conductor will be located. Etch the layer of amorphous silicon and the oxide to form the contact hole. Ash the photoresist in oxygen plasma and clean the wafer.

Next deposit 250 Å of amorphous silicon onto the exposed silicon layer and anneal at 650° C. for 10 hours in nitrogen to convert the amorphous silicon to polysilicon. Coat the wafer with photoresist. Align and expose the photoresist on a stepper with a photomask which leaves the photoresist on top of the wafer only in places where channels, sources and drains of thin film transistors, as well as connection lines are desired. Etch the polysilicon and then ash the remaining photoresist in oxygen plasma and clean the wafer. Deposit 100 Å of oxide on top of the wafer, implant the wafer to adjust the threshold voltage of the thin film transistor, if necessary. The source and drain electrodes and the connection lines should then be selectively doped by means of masked implant to increase their conductivity.

This finishes the thin film transistor formation, and the wafer is then cleaned and ready for further processing.

This is merely exemplary of a specific embodiment of practicing the present invention and can be varied, depending upon the particular desired thin film transistor and conductor.

The method of the present invention provides a thin film transistor wherein the dielectric layer is not contaminated by the photolithography process. This can be used at any time when the layer forming the transistor body also forms a connector to a second electrode or conductor. Overall, this reduces contamination of the transistor and improves its reliability.

This has been a description of the present invention, along with the best mode currently known of practicing that invention. However, the invention itself should only be defined by the appended claims, wherein we claim:

What is claimed is:

1. A method of forming an interconnect between a transistor body above a gate electrode and a conductor, said conductor and said gate electrode deposited on a semiconductor substrate, the method comprising:

depositing a continuous insulating layer covering said conductor and said gate electrode said conductor and said gate electrode being laterally spaced apart on said semiconductor substrate;

depositing a first polysilicon layer on said continuous insulating layer, said first polysilicon layer covering at least a portion of said gate electrode and said conductor;

defining a contact opening through said first polysilicon layer and said continuous insulating layer to said conductor;

depositing a second polysilicon layer over said first polysilicon layer and into said contact opening to said conductor, thereby providing a combined polysilicon layer providing an electrical connection from said conductor to said first polysilicon layer above said gate electrode, removing portions of said first and second polysilicon layers to establish a transistor body above said gate electrode, connected to said conductor.

2. The method claimed in claim 1 wherein said first polysilicon layer is formed by depositing a first layer of amorphous silicon and subsequently annealing said first layer of amorphous silicon to form polysilicon.

3. The method claimed in claim 2 wherein said second polysilicon layer is formed by depositing a second layer of amorphous silicon and subsequently annealing said second layer of amorphous silicon to form polysilicon.

4. The method claimed in claim 3 wherein said first and second layers of amorphous polysilicon are annealed simultaneously.

5. The method claimed in claim 1 wherein said conductor is a thin film transistor gate electrode.

6. The method claimed in claim 1 wherein said conductor is a transistor source electrode.

7. The method claimed in claim 1 wherein said conductor is a transistor drain electrode.

8. The method claimed in claim 2 wherein said contact opening is defined by photolithographically defining and etching a portion of said first amorphous silicon layer using a photolithographic mask, wherein said first amorphous silicon layer separates said photolithographic mask from said continuous insulating layer.

9. The method claimed in claim 1 wherein said portions of said combined polysilicon layer are removed to establish said transistor body by photolithographically defining and etching said combined polysilicon layer.

* * * * *